United States Patent [19]

Fujiki et al.

[11] Patent Number: 4,902,983
[45] Date of Patent: Feb. 20, 1990

[54] NONLINEAR SIGNAL GENERATING CIRCUIT AND NONLINEAR COMPENSATING DEVICE USING THE SAME

[75] Inventors: Yoshinori Fujiki; Masatoshi Ishida, both of Tokyo; Nobuaki Imai; Toshio Nojima, both of Kanagawa, all of Japan

[73] Assignees: NEC Corporation; Nippon Telegraph and Telephone Corp., both of Tokyo, Japan

[21] Appl. No.: 151,333

[22] Filed: Feb. 2, 1988

[30] Foreign Application Priority Data

Feb. 2, 1987 [JP] Japan .................. 62-20497
Feb. 2, 1987 [JP] Japan .................. 62-20498

[51] Int. Cl.⁴ .............................. H03F 1/32
[52] U.S. Cl. ...................... 330/149; 333/109; 330/151
[58] Field of Search .......... 307/317 R, 320, 268, 307/490; 330/149, 151, 107; 333/109, 117, 118

[56] References Cited

U.S. PATENT DOCUMENTS 4,122,399 10/1978 Heiter et al. .................. 330/149
4,602,227 7/1986 Clark et al. .................... 333/109

Primary Examiner—Steven Mottola
Attorney, Agent, or Firm—Sughrue, Mion, Zinn, Macpeak & Seas

[57] ABSTRACT

A device for compensating for nonlinearity of amplifiers by use of a predistortion principle, and a nonlinear signal generating circuit built in such a device. The nonlinear signal generating circuit includes a quadrature hybrid of the type using a distributed constant line. Two diodes and a terminal resistor are connected in parallel and opposite in polarity to each other and connected between the terminals of coupling and passing ports of the hybrid and ground. The nonlinear compensating device is constituted by the combination of a plurality of quadrature hybrids of the type using a distributed constant line and various kinds of diodes. All the circuit segments of the device are implemented with a planar circuit provided on a single dielectric substrate and diodes which are held in a pair chip condition. Such circuitry is accommodated in a single air-tight housing to complete a microwave integrated circuit.

11 Claims, 4 Drawing Sheets

NONLINEAR SIGNAL GENERATING CIRCUIT AND NONLINEAR COMPENSATING DEVICE USING THE SAME

BACKGROUND OF THE INVENTION

The present invention relates to a device for compensating for nonlinearity of amplifiers by use of a predistortion principle and a nonlinear signal generating circuit using such a device. More particularly, the present invention is concerned with a nonlinear compensating device of the type using a distortion generating circuit in which diodes are built in to serve as distortion generating elements.

Heretofore, a nonlinear signal generating circuit of the kind described has been implemented with a circulator. Specifically, a circulator is provided with a reflection port in addition to an input and an output port. Connected between the reflection port and ground is a parallel connection of two parallel diodes which are connected with polarities opposite to each other and a terminating resistor which is parallel to the diodes. The diodes serve as nonlinear elements. A radio frequency (RF) signal coming in through the input port is terminated by such a parallel circuit so that only nonlinear components generated by the diodes appear on the output port. A drawback with this kind of nonlinear signal generating circuit is that the bandwidth available is determined by that of the circulator and, therefore, cannot be wide enough as desired. Another drawback is that a magnet which is necessarily included in the circulator makes it difficult to implement the construction with a planar circuit and, thereby, obstructs the implementation of the circuit with a microwave integrated circuit. In addition, circulators having the same impedance are difficult to produce without adjustment and this, too, obstructs the implementation of the circuit with a microwave integration circuit.

On the other hand, a prior art nonlinear compensating device in which the above-described nonlinear signal generating circuit is installed to serve as a distortion generating circuit includes a power distributor, or power splitter, having an input terminal and a power combiner having an output terminal. An input signal is divided by the power distributor into two signals. One of the two signals is fed to the power combiner over a nonlinear route which includes the distortion generating circuit and a variable attenuator connected in series with the distortion generating circuit. The other signal is applied to the power combiner over a linear route which includes a delay line and a variable phase shifter connected in series with the delay line. The two signals delivered through the linear and nonlinear routes are combined by the power combiner in opposite phase and, then, fed out via the output port. Such a prior art nonlinear compensating device has some problems left unsolved. Specifically, since the linear and nonlinear routes lack symmetry, the phase difference between them has dependence upon frequency preventing the nonlinear compensating device from being provided with a wide bandwidth. In addition, since the individual structural elements are fabricated independently of each other and connected together by connectors and cables, difficulty is experienced in uniformizing the characteristics due to scattering in characteristic and others which are ascribable to the connection.

SUMMARY OF THE INVENTION

It is, therefore, an object of the present invention to provide a nonlinear signal generating circuit operable over a wide bandwidth.

It is another object of the present invention to provide a nonlinear signal generating circuit which can be implemented with a planar circuit and, therefore, with a microwave integrated circuit.

It is another object of the present invention to provide a nonlinear signal generating circuit which eliminates the need for adjustment.

It is another object of the present invention to provide a nonlinear compensating device with high wide band performance.

It is another object of the present invention to provide a nonlinear compensating device which eliminates scattering in characteristic due to the connection of individual structural elements, thereby promoting uniformization of characteristics.

In accordance with the present invention, a nonlinear signal generating circuit comprises a quadrature hybrid having an input port, a coupling port, a passing port and an output port, a first parallel connection constituted by a first and a second diode which are connected in parallel and opposite in polarity to each other and a first terminating resistor which is connected in parallel with the first and second diodes, the first parallel connection being connected at one end to the coupling port of the quadrature hybrid and at the other end to ground, and a second parallel connection constituted by a third and fourth diode which are connected in parallel and opposite in polarity to each other and a second terminating resistor which is connected in parallel with the third and fourth diodes, the second parallel connection being connected at one end to the passing port of the quadrature hybrid and at the other end to ground.

Further, in accordance with the present invention, a nonlinear compensating device comprises a power distributor constituted by an input terminal and a first quadrature hybrid, a distortion generator constituted by a second quadrature hybrid and nonlinear elements and connected to the power distributor, a variable attenuator constituted by a third quadrature hybrid and PIN diodes and connected to the distortion generating circuit, a fixed phase shifter constituted by a fourth quadrature hybrid and propagation lines and connected to the power distributor, a variable phase shifter constituted by a fifth quadrature hybrid and varactor diodes and connected to the fixed phase shifter, and a power combiner constituted by a sixth quadrature hybrid and an output terminal and connected to the variable attenuator and variable phase shifter.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
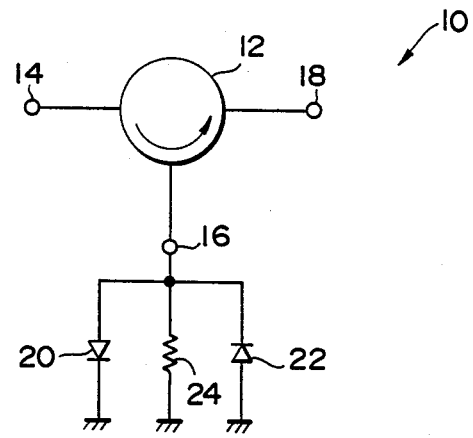
FIG. 1 is a diagram schematically showing a prior art nonlinear signal generating circuit of the type using a circulator.

Referring to FIG. 1 of the drawings, a prior art nonlinear signal generating circuit 10 includes a circulator 12 which has an input port 14, a reflection port 16, and an output port 18. Two diodes 20 and 22 are connected in parallel and opposite in polarity to each other to serve as nonlinear elements. A terminating resistor 24 is connected in parallel to the diodes 20 and 22. The parallel connection made up of the diodes 20 and 22 and terminating resistor 24 is connected at one end to the reflection port 16 and at the other end to ground. An RF signal coming in through the input port 14 is terminated by the parallel circuit so that only nonlinear components generated by the two diodes 20 and 22 are fed to the output port 18. With this prior art circuit 10 with the circulator 12, it is difficult to increase the bandwidth and to implement the circuit 10 with a microwave integrated circuit, as previously discussed.

Figure 2:
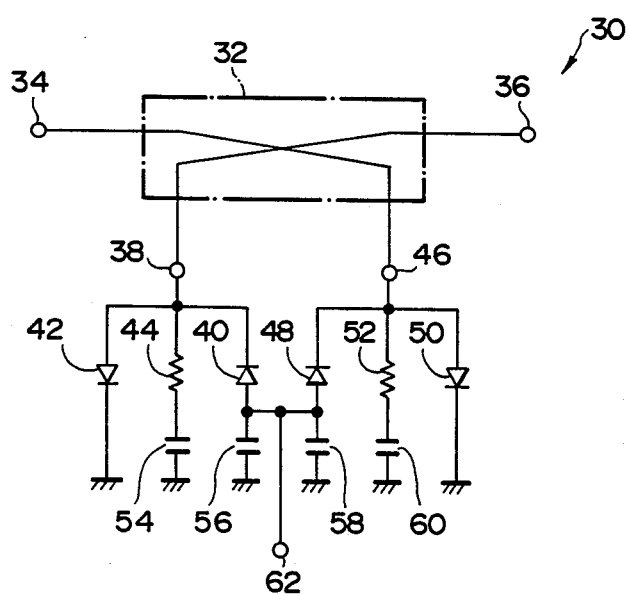
FIG. 2 is a schematic diagram showing one embodiment of a nonlinear signal generating circuit in accordance with the present invention.

Referring to FIG. 2, a nonlinear signal generating circuit embodying the present invention is shown and generally designated by the reference numeral 30. As shown, the circuit 30 includes a quadrature hybrid 32 as its major component. The quadrature hybrid 32 has an input port 34, an isolation port 36 which serves as an output port, a coupling port 38 to which two diodes 40 and 42 and a terminal resistor 44 are connected, and a passing port 46 to which two diodes 48 and 50 and a terminating resistor 52 are connected. The diodes 40 and 42 are connected in parallel and opposite in polarity to each other, and so are the diodes 48 and 50. With respect to high frequency, the diodes 40 and 48 and the terminal resistors 44 and 52 are connected to ground by bypass capacitors 54, 56, 58 and 60, respectively. On the other hand, the diodes 42 and 50 are connected to ground directly. A bias terminal 62 is provided at the junction of the diodes 40 and 48 and bypass capacitors 56 and 58, allowing a bias current to be fed to the four didoes 40, 42, 48, and 50 therethrough. In this construction, a high frequency signal applied to the input port 34 is divided to reach the coupling port 38 on one hand and the passing port 46 on the other hand. The signal reaching the coupling port 38 is terminated by the diodes 40 and 42 and terminating resistor 44 while the other signal reached the passing port 46 is terminated by the diodes 48 and 50 and terminating resistor 52. As a result, only nonlinear signals which are individually generated by the diodes 40 and 42 and the diodes 48 and 50 are combined by the quadrature hybrid 32, a composite signal appearing on the output port 36.

The nonlinar signal generating circuit 30 having the above construction is advantageously operable over a wide bandwidth because its major element is the quadrature hybrid 32. The quadrature hybrid 32 can readily be implemented with a planar circuit and, therefore, allows the circuit 30 to be fabricated in a microwave integrated circuit configuration. In addition, the quadrature hybrid 32 eliminates the need for adjustment.

Figure 3:
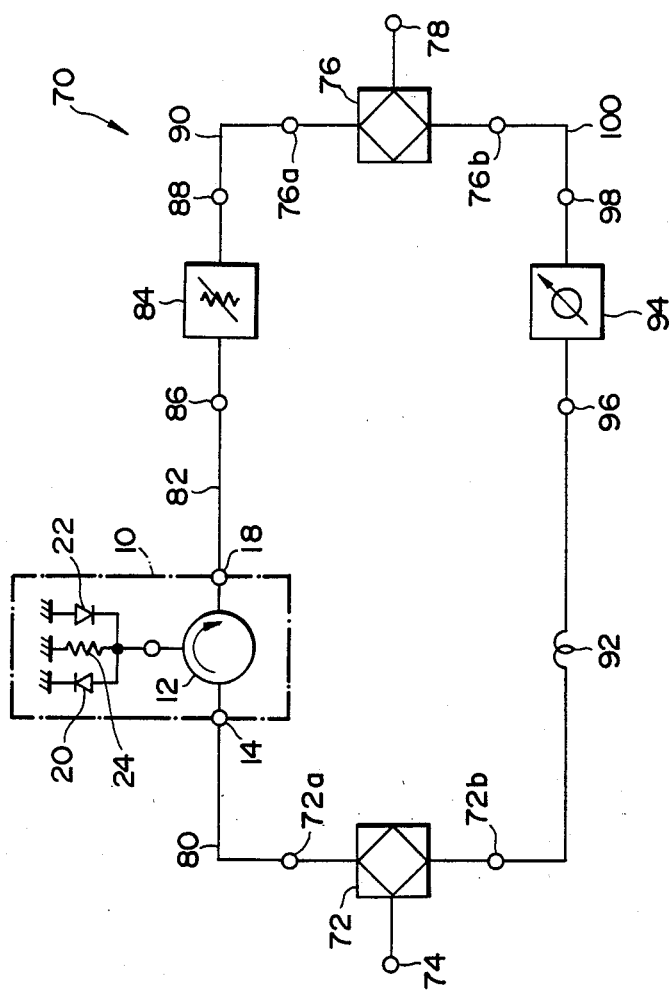
FIG. 3 is a schematic block diagram showing a prior art nonlinear compensating device.

Referring to FIG. 3, there is shown a prior art nonlinear compensating device 70 which uses the prior art nonlinear signal generating circuit 10 of the type using a circulator as shown in FIG. 1 for a distortion generating circuit. As shown, the compensating device 70 includes a power distributor 72 having an input terminal 74 and two output terminals 72a and 72b, and a power combiner 76 having an output terminal 78 and two input terminals 76a and 76b. The output terminal 72a of the power distributor 72 is connected to the input port 14 of the distortion generating circuit 10 via a connecting line 80. The output port 18 of the distortion generating circuit 10 is connected to an input terminal 86 of a variable attenuator 84 the output terminal 88 of which is connected to the input terminal 76a of the power combiner 76 by a line 90. The path extending from the output terminal 72a of the power distributor 72 to the input terminal 76a of the power combiner 76 via the line 80, distortion generating circuit 10, line 82 and variable attenuator 84 constitutes a nonlinear route. the other output terminal 72b of the power distributor 72 is connected to an input terminal 96 of a variable phase shifter 94 by a delay line 92. An output terminal 98 of the variable phase shifter 94 is connected to the input terminal 76b of the power combiner 76 by a line 100. The path extending from the output terminal 72b of the power distributor 74 to the other input terminal 76b of the power combiner 76 via the delay line 92, variable phase shifter 94 and line 100 constitutes a linear route. An input signal applied to the input terminal 74 of the power distributor 72 is divided into two signals one of which is propagated through the nonlinear route and the other through the linear route. The power combiner 76 combines the two signals in opposite polarity and, then, delivers the resulting composite signal via the output terminal 78. This kind of prior art compensating circuits is limited in wide band performance and suffers from scattering in characteristic, as stated earlier.

Figure 4:
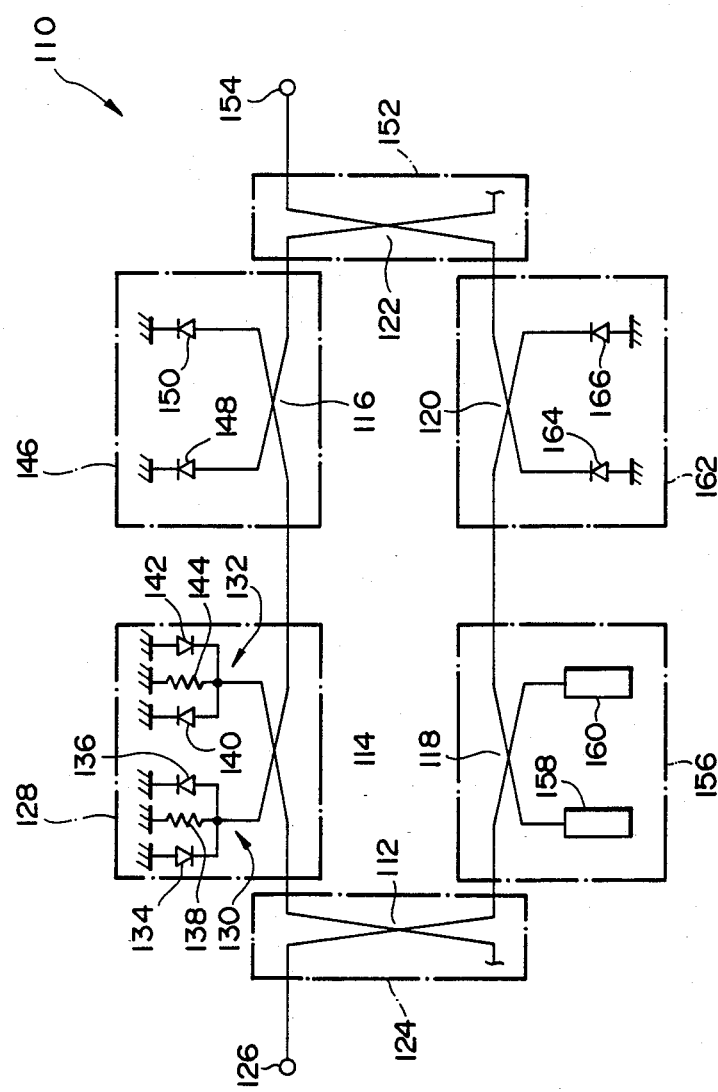
FIG. 4 is a schematic block diagram showing a nonlinear compensating device in accordance with the present invention.

Referring to FIG. 4, a nonlinear compensating device in accordance with the present invention is shown which is free from the drawbacks discussed above. As shown, the compensating device, generally 110, includes six quadrature hybrids 112, 114, 116, 118, 120 and 122 which are identical in distributed constant line. The first quadrature hybrid 112 is connected to an input terminal 126 and serves as a power distributor 124. One of two output terminals of the power distributor 124 is connected to a distortion generating circuit 128 which is identical with the distortion generating circuit shown in FIG. 2 except for a DC biasing circuit and the bypass capacitors 54 to 60. The circuit 128 is constituted by the second quadrature hybrid 114 and two parallel connections 130 and 132 connected to the hybrid 114. The parallel connection 130 is made up of diodes 134 and 136 and a terminal 138 connected in parallel with the diodes 134 and 136 while the parallel connection 132 is made up of diodes 140 and 142 and a terminating resistor 144 connected in parallel with the diodes 140 and 142. The diodes 134 and 136 are connected in parallel in opposite relation to each other with respect to polarity, and so are done the diodes 140 and 142, each diode serving as a nonlinear element. Connected to the distortion generating circuit 128 is a variable attenuator 146 which is constituted by the third quadrature hybrid 116 and two PIN diodes 148 and 150. A DC biasing circuit for these diodes 148 and 150 is not shown in FIG. 4. The variable attenuator 146 is connected to a power combiner 152 which is constituted by the sixth quadrature hybrid 122 and provided with an output terminal 154. In this manner, the distortion generating circuit 128 and variable attenuator 146 are cascaded between the power distributor 124 and power combiner 152 to set up a nonlinear route.

A fixed phase shifter 156 is made up of the fourth quadrature hybrid 118 and two distributed constant lines 158 and 160. The fixed phase shifter 156 is connected to the other output terminal of the power distributor 124 and to a variable phase shifter 162 which consists of the fifth quadrature hybrid 120 and two varactor diodes 164 and 166. A DC biasing circuit for these varactor diodes is not shown in FIG. 4. With respect to a variable phase shifter of this type, a reference may be made to U.S. Pat. No. 4,638,269 issued Jan. 20, 1987. The variable phase shifter 162 is connected to the power combiner 152. As stated, the fixed phase shifter 156 and variable phase shifter 162 are cascaded between the power distributor 124 and the power combiner 152 to complete a linear route which is symmetrical to the previously mentioned nonlinear route. Signals propagated through the two routes are combined in opposite phase by the power combiner 152 so that a composite signal appears on the output terminal 154.

Figure 5:
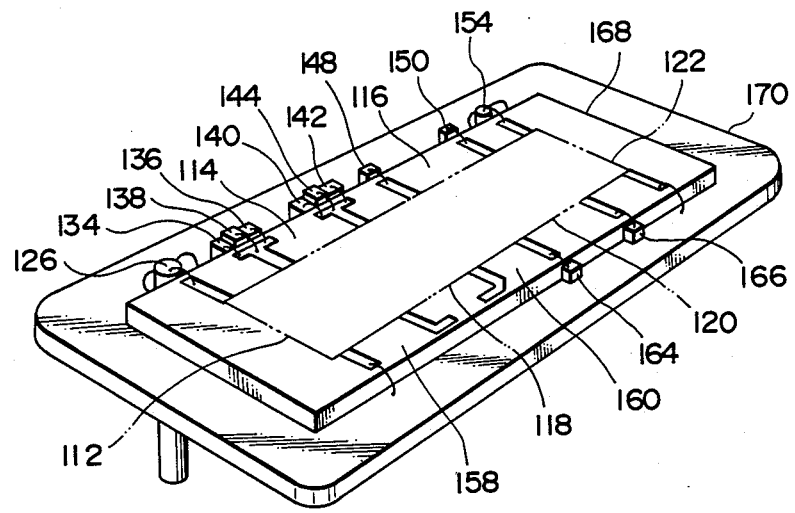
FIG. 5 is a perspective view showing the device of FIG. 4 which is constructed into a microwave integrated circuit.

As shown in FIG. 5, the diodes 134, 136, 140 and 142, the resistors 138 and 144, the PIN diodes 148 and 150, and varactor diodes 164 and 166 which are built in the compensating device 110 are used in pair chips without exception. Further, all the quadrature hybrids 112, 114, 116, 118, 120 and 122 are provided in patterns (microstrip lines) on a single dielectric substrate 168 together with their associated connecting lines and fixed phase shifter 156. All the circuits are accommodated in a single air-tight housing 170 to complete a microwave integrated circuit. Such a configuration allows a minimum scattering due to connection and scattering in characteristic due to unnecessary reactance to occur, whereby characteristics are uniformalized. In addition, by virtue of the symmetry established between the nonlinear and linear routes, i.e., the identical phase characteristic of the two routes, the frequency-dependence of the phase difference between the two routes is effectively reduced to allow the frequency band to be broadend as desired.

In summary, it will be seen that a nonlinear signal generating circuit of the present invention exhibits desirable wide band performance, can be implemented with a planar circuit and, therefore, with a microwave integrated circuit with ease, and eliminates the need for adjustment. All these advantages are derived from the use of a quadrature hybrid.

Further, a nonlinear compensating device of the present invention achieves a wide bandwidth as well as uniform characteristics because it uses the combination of quadrature hybrids and various kinds of diodes, and because they are provided on a single dielectric substrate and accommodated in a single air-tight housing with symmetry of the circuit preserved.

Various modifications will become possible for those skilled in the art after receiving the teachings of the present disclosure without departing from the scope thereof.

What is claimed is:

1. A nonlinear signal generating circuit comprising:
   a quadrature hybrid having an input port, a coupling port, a passing port and an output port;
   a first parallel connection constituted by a first and a second diode which are connected in parallel and opposite in polarity to each other and a first terminating resistor which is connected in parallel with said first and second diodes, said first parallel connection being connected at one end to said coupling port of said quadrature hybrid and at the other end to ground; and
   a second parallel connection constituted by a third and a fourth diode which are connected in parallel and opposite in polarity to each other and a second terminating resistor which is connected in parallel with said third and fourth diodes, said second parallel connection being connected at one end to said passing port of said quadrature hybrid and at the other end to ground, wherein said first diode of said first parallel connection and said third diode of said second parallel connection are connected to be identical in polarity, said second diode and said fourth diode are connected to be identical in polarity, and wherein first, second, third and fourth capacitors are connected between said first terminating resistor and ground, between said second diode and ground, between said second terminating resistor and ground, and between said fourth diode and ground, respectively.

2. A circuit as claimed in claim 1, wherein said output port comprises an isolation port.

3. A circuit as claimed in claim 1, wherein said first and second parallel connections each serves as a nonlinear element.

4. A circuit as claimed in claim 1, further comprising a bias terminal connected to a junction of said second diode and second capacitor and a junction of said fourth diode and fourth capacitor for feeding a bias current to said first and fourth didoes.

5. A nonlinear compensating device comprising:
   a power distributor constituted by an input terminal and a first quadrature hybrid;
   a distortion generator constituted by a second quadrature hybrid and nonlinear elements and connected to said power distributor;
   a variable attenuator constituted by a third quadrature hybrid and PIN diodes and connected to said distortion generating circuit;
   a fixed phase shifter constituted by a fourth quadrature hybrid and propagation lines and connected to said power distributor;
   a variable phase shifter constituted by a fifth quadrature hybrid and varactor diodes and connected to said fixed phase shifter; and
   a power combiner constituted by a sixth quadrature hybrid and an output terminal and connected to said variable attenuator and variable phase shifter.

6. A device as claimed in claim 5, wherein said power distributor, distortion generating circuit, variable attenuator and power combiner which are cascaded constitute a nonlinear route, and said power distributor, fixed phase shifter, variable phase shifter and power combiner which are cascaded constitute a linear route, said nonlinear and linear routes being symmetrical to each other.

7. A device as claimed in claim 6, wherein a signal applied to said input terminal is propagated through said linear and nonlinear routes, then combined in opposite phase by said power combiner, and then fed out through said output terminal.

8. A device as claimed in claim 5, further comprising a dielectric substrate on which said power distributor, distortion generating circuit, variable attenuator, fixed phase shifter, variable phase shifter and power combiner are mounted.

9. A device as claimed in claim 8, wherein all of said PIN diodes and varactor diodes are mounted on said dielectric substrate in pair chips, and said first to sixth quadrature hybrids and propagation lines are provided in patterns on said dielectric substrate.

10. A device as claimed in claim 9, wherein said non-linear elements are constituted by diodes, and said propagation lines are constituted by distributed constant lines.

11. A device as claimed in claim 10, further comprising an air-tight housing accommodating said dielectric substrate on which said structural elements are mounted.

* * * * *

UNITED STATES PATENT AND TRADEMARK OFFICE
CERTIFICATE OF CORRECTION

PATENT NO. : 4,902,983

DATED : February 20, 1990

INVENTOR(S) : Yoshinori Fujiki et al

It is certified that error appears in the above-identified patent and that said Letters Patent is hereby corrected as shown below:

Column 6, line 30, delete "didoes", and insert --diodes--.

Signed and Sealed this

Ninth Day of April, 1991

Attest:

*Attesting Officer*

HARRY F. MANBECK, JR.

*Commissioner of Patents and Trademarks*